United States Patent
Goh et al.

(10) Patent No.: US 11,332,364 B1
(45) Date of Patent: May 17, 2022

(54) METHOD FOR FORMING MEMS CAVITY STRUCTURE

(71) Applicant: AAC ACOUSTIC TECHNOLOGIES (SHENZHEN) CO., LTD., Shenzhen (CN)

(72) Inventors: Wooicheang Goh, Singapore (SG); Shrowthi S. N. Bharadwaja, Irvine, CA (US); Kahkeen Lai, Singapore (SG)

(73) Assignee: AAC Technologies Pte. Ltd., Singapore (SG)

( * ) Notice: Subject to any disclaimer, the term of this patent is extended or adjusted under 35 U.S.C. 154(b) by 0 days.

(21) Appl. No.: 17/161,705

(22) Filed: Jan. 29, 2021

(51) Int. Cl.
*B81C 1/00* (2006.01)
*H01L 21/02* (2006.01)

(52) U.S. Cl.
CPC ...... *B81C 1/00476* (2013.01); *B81C 1/00047* (2013.01); *B81C 1/00158* (2013.01); *B81C 1/00531* (2013.01); *B81C 1/00539* (2013.01); *B81C 1/00952* (2013.01); *B81C 2201/0107* (2013.01); *B81C 2201/0108* (2013.01); *B81C 2201/0132* (2013.01); *B81C 2201/0133* (2013.01); *B81C 2203/03* (2013.01); *H01L 21/0228* (2013.01)

(58) Field of Classification Search
CPC ............ B81C 1/00476; B81C 1/00531; B81C 1/00539; B81C 1/00047; B81C 1/00158; B81C 1/00952; B81C 2203/03; B81C 2201/0132; B81C 2201/0108; B81C 2201/0107; B81C 2201/0133; H01L 21/0228
USPC .......................................... 216/2, 33, 34, 36
See application file for complete search history.

(56) References Cited

U.S. PATENT DOCUMENTS

| | | | | |
|---|---|---|---|---|
| 8,394,307 | B2 * | 3/2013 | Ikeda | B41J 2/1603 |
| | | | | 264/221 |
| 9,481,569 | B2 * | 11/2016 | Zinn | H04R 31/003 |
| 2014/0231937 | A1 * | 8/2014 | Losa | B81C 1/00801 |
| | | | | 257/415 |

FOREIGN PATENT DOCUMENTS

| CN | 106829851 A | * | 6/2017 | |
|---|---|---|---|---|
| JP | 2020082339 A | * | 6/2020 | B81C 1/00182 |

* cited by examiner

*Primary Examiner* — Lan Vinh
(74) *Attorney, Agent, or Firm* — W&G Law Group

(57) ABSTRACT

The present invention relates to the field of semiconductor technology and provides a method for forming an MEMS cavity structure, which can improve process yield for MEMS integration and encapsulation for functional stability and reliability of the MEMS structure. The method includes steps of: forming an adhesion material layer on a bottom layer; forming a bottom layer on a substrate; forming a adhesion material layer on the bottom layer; forming a support structure and a sacrificial layer that is filled in a space surrounded by the support structure on the adhesion material layer; forming a capping layer on the support structure and the sacrificial layer, and the bottom layer, the support structure and the capping layer together defining a cavity; and releasing the sacrificial layer and the adhesion material layer to form the cavity structure.

13 Claims, 3 Drawing Sheets

METHOD FOR FORMING MEMS CAVITY STRUCTURE

TECHNICAL FIELD

The present invention relates to the field of semiconductor technologies, and more particularly, to a method for forming an MEMS cavity structure.

BACKGROUND

Micro-Electro-Mechanical Systems (MEMS) are formed on semiconductor and CMOS substrates using thin film deposition, lithography, and etch techniques. The MEMS devices offer advantages such as smaller dimensions, ability to integrate at lower cost and ability to control with CMOS circuitry. Hence MEMS devices are being widely used in various fields/applications.

Examples of MEMS devices include rf-capacitors, rf-ohmic switches, MEMS gyros, MEMS ultrasonic devices, and all types of MEMS devices that consist of oxide/nitrides/metal etc. layers as diaphragms. Many MEMS devices require hermitic encapsulation in cavity structures for wafer level packaging requirements. These cavity structures can protect these fragile MEMS devices from environment and are necessary to obtain high performance. These cavities can be maintained at various vacuum levels and/or partial fills with inert gaseous ambient.

The MEMS cavity structure is a structure that is widely used in the MEMS field, for example, a cavity structure is formed in an rf-capacitor, an rf-ohmic switch, MEMS gyros, MEMS ultrasonic devices, and all types of MEMS devices that consist of oxide/nitrides/metal layers as diaphragms. In a method for forming the MEMS cavity structure in the related art, the cavity structure is formed by depositing an amorphous sacrificial layer (such as a-Si, a-Ge, or polymer) and then releasing the sacrificial layer by wet, dry, vapor etchants.

However, the amorphous films have an inferior adhesion performance on materials such as dielectric thin films (example: thin-film aluminum oxide) and metal thin films. As a result, delamination defects form in sacrificial layers and adversely affect active layers due to poor adhesion during subsequent process steps, such as deposition, cmp or etch etc., thereby causing low yields and in some instances scraping entire wafers. Meanwhile, during the MEMS release process in a fluorine based etchant, after the sacrificial layer is removed, the etchant will fluorinate surfaces of the dielectric and the metal thin films. The fluorinated dielectric and/or metal layers are highly hydrophilic in nature and may contribute to stiction related MEMS failure during operation. Some instances, stiction can severely cause material wear on active and/or passive surfaces with repeated physical contacts under cycling operation.

SUMMARY

The embodiments of the present invention provide a method for forming an MEMS cavity structure, which can improve process yields for MEMS manufacturability, functional stability, and reliability.

In an aspect, an embodiment of the present invention provides method for forming an MEMS cavity structure, including steps of: forming an adhesion material layer on a bottom layer; forming a support structure and a sacrificial layer that is filled in a space surrounded by the support structure on the adhesion material layer; forming a capping layer on the support structure and the sacrificial layer, and the bottom layer, the support structure and the capping layer together defining a cavity; and releasing the sacrificial layer and the adhesion material layer to form the cavity structure.

As an improvement, the bottom layer is a substrate.

As an improvement, prior to the step of forming an adhesion material layer on a bottom layer, the method further includes a step of forming a bottom layer on a substrate, As an improvement, prior to the step of forming an adhesion material layer on a bottom layer, the method further includes a step of performing pretreatment on the bottom layer to improve surface energy of the bottom layer.

As an improvement, prior to the step of forming a support structure and a sacrificial layer on the adhesion material layer, the method further comprises a step of performing pretreatment on the adhesion material layer to improve surface energy of the adhesion material layer.

As an improvement, no pretreatment is performed on the bottom layer prior to the step of forming an adhesion material layer on a bottom layer, and no pretreatment is performed on the adhesion material layer prior to the step of forming a support structure and a sacrificial layer on the adhesion material layer.

As an improvement, prior to the step of forming a support structure and a sacrificial layer that is filled in a space surrounded by the support structure on the adhesion material layer, the method further includes a step of performing pretreatment on the adhesion material layer to improve surface energy of the adhesion material layer As an improvement, said releasing the sacrificial layer and the adhesion material layer includes: patterning the capping layer to form a release hole that penetrates through the capping layer into the cavity; and releasing the sacrificial layer and the adhesion material layer through the release hole.

As an improvement, said releasing the sacrificial layer and the adhesion material layer includes: releasing the sacrificial layer and the adhesion material layer based on designed etching time and a designed etching rate, to further remove the adhesion material layer in the cavity after the sacrificial layer is removed.

As an improvement, the method further includes: determining the designed etching time and designed etching rate based on a material and a thickness of the adhesion material layer.

As an improvement, said releasing the sacrificial layer and the adhesion material layer includes: etching the sacrificial layer and the adhesion material layer with wet etchant, dry etchant, or vapor etchant.

As an improvement, a material of the adhesion material layer is oxide, nitride, metal or sub-oxide.

As an improvement, the bottom layer is dielectric or a metal thin film.

As an improvement, a material of the metal thin layer is aluminum, ruthenium, rhodium, tungsten or iridium.

As an improvement, the capping layer is MEMS structure or membrane.

As an improvement, a material of the sacrificial layer is amorphous silicon, amorphous germanium, or polymer.

Compared with the process method in the related art, in the method for forming the MEMS cavity structure provided by the embodiments of the present invention, the adhesion material layer is formed on the bottom layer, and then the sacrificial layer is formed on the adhesion material layer. A purpose of forming the adhesion material layer is to improve amorphous film adhesion with the bottom layer of the cavity.

By performing pretreatment on the bottom layer and/or the adhesion material layer, the surface energy of the bottom layer and/or the adhesion material layer is improved; thereby further enhancing adhesion between the sacrificial layer and the bottom layer. After adhesion between the sacrificial layer and the underlying dielectric or metal layer is improved, integrity of the sacrificial layer in the subsequent process is enhanced without amorphous layer delamination during subsequent integration steps, thereby resulting in high production yields. Meanwhile, the adhesion material layer as an adhesion promoter also plays a role of isolation, and the sacrificial layer is isolated from the bottom layer by the adhesion material layer. In this case, during sacrificial layer release process, the adhesion material layer can reduce exposure time of the bottom layer to etchant gaseous/vapor chemistries; thereby the bottom surface layer is prevented from fluorination and improves hydrophobicity of the contact surface in the cavity, and thus extending reliability and lifetime of the device.

BRIEF DESCRIPTION OF DRAWINGS

In order to better illustrate technical solutions in embodiments of the present invention or in the related art, the accompanying drawings used in the embodiments and in the related art are briefly introduced as follows. It should be noted that the drawings described as follows are merely part of the embodiments of the present invention, and other drawings can also be acquired by those skilled in the art without paying creative efforts.

DESCRIPTION OF EMBODIMENTS

In order to make purposes, technical solutions, and advantages of the embodiments of the present invention clearer, the technical solutions in the embodiments of the present invention are described in the following with reference to the accompanying drawings in the embodiments of the present invention. It should be noted that the described embodiments are merely exemplary embodiments of the present invention, which shall not be interpreted as limiting the present invention. All other embodiments obtained by those skilled in the art without creative efforts according to the embodiments of the present invention are within the scope of the present invention.

The terms used in the embodiments of the present invention are merely for the purpose of describing particular embodiments but not intended to limit the present invention. Unless otherwise noted in the context, the singular form expressions "a", "an", "the" and "said" used in the embodiments and appended claims of the present invention are also intended to represent plural form expressions thereof.

In order to further illustrate the beneficial effects of the embodiments of the present invention, before describing the embodiments of the present invention in detail, a process through which the inventor finds the problems in the prior art will be described in the following. In the existing method for forming the MEMS cavity structure, the cavity structure is formed by depositing a sacrificial layer and then releasing the sacrificial layer by an etchant. Amorphous or polymer sacrificial layers are required, in some instances, on high contact angle materials such as alumina etc. As a result, the sacrificial layer adhesion with such high contact angle materials becomes complicated for MEMS integration. In an aspect, the amorphous or polymer sacrificial layers have an inferior interfacial adhesion on dielectric and metal thin film materials, resulting delamination of sacrificial layers causing defects in active layers during subsequent process steps, such as deposition, cmp, and etch etc. In addition, during the MEMS device release process, after the sacrificial layer is removed, the fluorine base chemistry etchant will fluorinate surfaces of the dielectric and/or metal thin films, thereby contributing to stiction related MEMS failure during operation and causing material wear on surfaces. Therefore, in terms of the above-mentioned problem, the present invention provides an improved method for forming an MEMS cavity structure.

Figure 1:
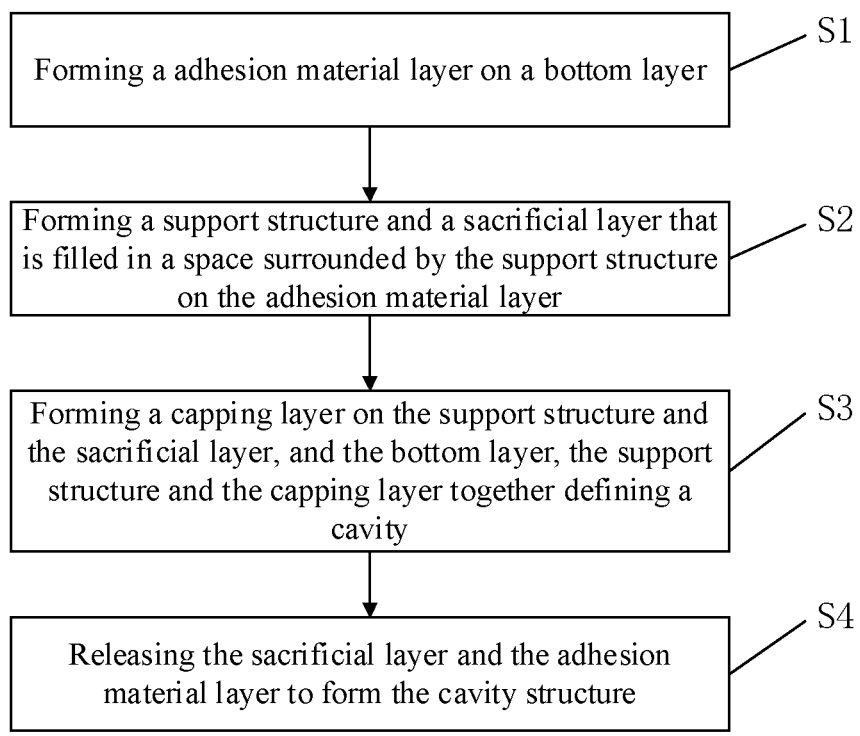
FIG. 1 is a schematic flowchart of a method for forming an MEMS cavity structure according to an embodiment of the present invention.

FIG. 1 is a schematic flowchart of a method for forming an MEMS cavity structure according to an embodiment of the present invention. As shown in FIG. 1, an embodiment of the present invention provides a method for forming an MEMS cavity structure, and the method includes the following steps.

At step S1, an adhesion material layer is formed on a bottom layer. The adhesion material layer may be oxide, nitride, metal (ex: W) or metal sub-oxide, but not thermal oxide. The bottom layer may be a substrate (CMOS substrate or blanket substrate). The bottom layer may also be an MEMS structure layer formed on the substrate prior to step S1. In this case, the bottom layer may be a dielectric layer or a metal layer. A material of the dielectric layer may be aluminum oxide, and a material of the metal layer may be aluminum, ruthenium, rhodium, tungsten or iridium.

At step S2, a support structure and a sacrificial layer that is filled in a space surrounded by the support structure are formed on the adhesion material layer. A material of the sacrificial layer may be a-Si, a-Ge, or polymer. Even polymers on high contact angle materials may have adhesion issues. Therefore, HMDS is being used for polyimides, or photoresists prior to coating these layers onto the substrate, At step S3, a capping layer is formed on the support structure and the sacrificial layer, and the bottom layer, the support structure and the capping layer together define a cavity. The capping layer may be an active MEMS structure or membrane.

At step S4, the sacrificial layer and the adhesion material layer are released, so as to form the cavity structure.

The method for forming the cavity structure provided by the present invention can be applied to any process in which a cavity needs to be formed during a manufacturing process of the MEMS device. For example, the method can be applied to the manufacturing process of MEMS devices with any shape such as a beam structure, a bridge structure or a diaphragm structure etc. Taking the diaphragm structure as an example, the diaphragm is the capping layer, and the diaphragm support structure can form the cavity.

Compared with the process method in the related art, the method provided by the present invention, the adhesion material layer is formed on the bottom layer at the step S1, and then the sacrificial layer is formed on the adhesion material layer at the step S2. One purpose of forming the adhesion material layer is to improve amorphous layer adhesion on the bottom layer of the cavity. The adhesion material layer may be ultra-thin oxide, nitride, metal or sub-oxide (such as $WO_x$, $SnO_x$), that can be formed using physical or chemical thin film deposition approaches. The adhesion material layer can increase contact angles for better amorphous layer adhesion. The low-temperature sacrificial layer is adhered to a surface of aluminum oxide or other dielectric/metal. After adhesion between the sacrificial layer and the underlying dielectric or metal layer is improved, integrity of the sacrificial layer in the subsequent processes is enhanced without amorphous layer delamination, thereby resulting higher production yields during later processing.

As a preferred embodiment provided by the present invention, the bottom layer may be pretreated before step S1 to improve the surface energy of the bottom layer. And/or before step S2, the adhesion material layer is pretreated to improve the surface energy of the adhesion material layer. The pretreatment methods include plasma, thermally induced gaseous, and/or wet chemistries treatments. After pretreatment of the bottom layer surface, adhesion between the bottom layer and the adhesion material layer can be further enhanced. Similarly, after the adhesion material surface is pretreated, adhesion between the adhesion material layer and the sacrificial layer can be further enhanced, and such surface chemical treatment will not affect the performance of the device.

In addition, the adhesion material layer as an adhesion promoter also plays a role of isolation, and the sacrificial layer is isolated from the bottom layer by the adhesion material layer. In this case, when the sacrificial layer is released at the step S4, the adhesion material layer can reduce exposure time of the bottom layer to an etching material, thereby preventing the surface of the bottom layer from being fluorinated. This method can increase hydrophobicity of the contact surface in the cavity, the bottom layer surface condition can be modified and/or controlled for better hydrophobic nature upon sacrificial layer release process, thereby extending reliability of the device, for example, extending switching cycle lifetime for rf-devices during operation.

Specifically, a process of releasing the sacrificial layer and removing the adhesion material layer in the cavity at the step S4 includes: releasing the sacrificial layer and the adhesion material layer based on designed etch duration and etch rate, to further remove the adhesion material layer in the cavity after the sacrificial layer is removed. Here, the etching duration and the etch rate are determined based on the material and thickness of the adhesion material layer.

For example, the etchant adopts $XeF_2$, the adhesion material layer adopts ultra-thin oxide, and the sacrificial layer adopts amorphous material. In the release etch process of the amorphous sacrificial layer, after the surface of the ultra-thin oxide is exposed, the ultra-thin oxide can be removed in $XeF_2$. The etch rates of the oxide layer are much lower than amorphous material in $XeF_2$. Therefore, the etch duration and the etch rate are determined based on the material and thickness of the selected ultra-thin oxide, so that the ultra-thin oxide can completely be removed during the $XeF_2$ release process while minimizing the exposure time of the underlying surfaces to $XeF_2$, thereby minimizing fluorination of those surfaces.

The etch rates for ultra-thin oxide can be considered to process such layers for optimization of the sacrificial layer release etch process parameters pertaining to specific MEMS designs. The sacrificial layer release process in $XeF_2$ is an exothermic process, and as a result the ultra-thin oxide may be eroded faster inside cavity. However, during MEMS release process, this layer is intact and can be detected on the dielectric/metal layers underneath the field dielectric regions and/or a-Si dummy fills in areas outside the released cavity. Appropriate tear-down process along with suitable microscopic and/or chemical elemental analysis can detect this layer in the field regions on top of metal lines or pads.

Preferred embodiments of the method for forming the MEMS cavity structure provided by the present invention applied to an integration process of rf-capacitor or rf-ohmic switches will be described in detail in the following with reference to the accompanying drawings, so as to further illustrate the technical methods and effects of the present invention.

Figure 2A:
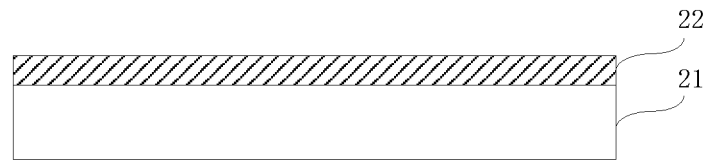
FIGS. 2A-2G each is a schematic cross-sectional view of an MEMS cavity structure in a respective step of a method for forming an MEMS cavity structure.

As shown in FIG. 2A, a silicon wafer substrate 21 is processed until a specific step in which a bottom layer 22 is deposited on the silicon wafer substrate 21 and patterned. The bottom layer 22 may be dielectric, a metal thin film, or an atomic layer deposited by atomic layer deposition (ALD) technology.

Figure 2B:
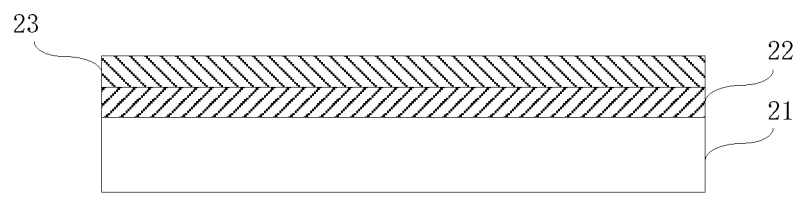

As shown in FIG. 2B, an adhesion material layer 23, which is made of ultra-thin silicon dioxide (100-200A), is deposited on the bottom layer 22, and may be formed by ALD, APCVD, PECVD, HDPCVD, SACVD, sputtering and other methods. Silicon dioxide has good adhesion to the bottom layer 22 which is dielectric, a metal thin film or an atomic layer.

Figure 2C:
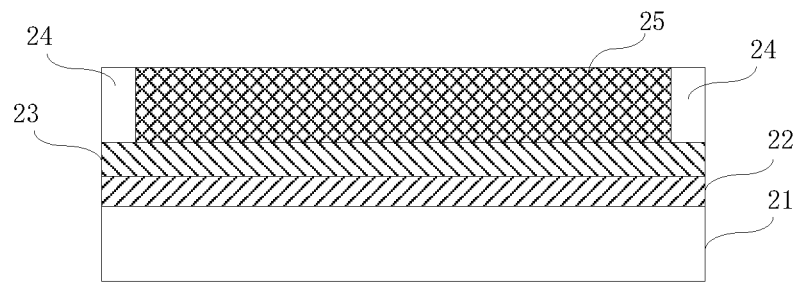

As shown in FIG. 2C, a support structure 24 and a sacrificial layer 25 that is filled in a space surrounded by the support structure are formed on the adhesion material layer 23. The sacrificial layer 25 is made of an amorphous silicon material, which has good adhesion to the adhesion material layer 23 made of silicon dioxide. Although only one cavity structure is illustrated in the figure, it does not mean that only one cavity structure is formed on the silicon wafer substrate 21 in the process of the present invention, and a plurality of cavity structures may be formed on the silicon wafer substrate 21. The thickness of the sacrificial layer defines a gap height for MEMS above and/or below the moving MEMS structure. Controlling the thickness of the a-Si sacrificial layer precisely is necessary for acceptable variation of device operational parameters (for example, pull in, pull up, and release voltages, capacitances, contact forces, etc.,) critical to their operation.

Figure 2D:
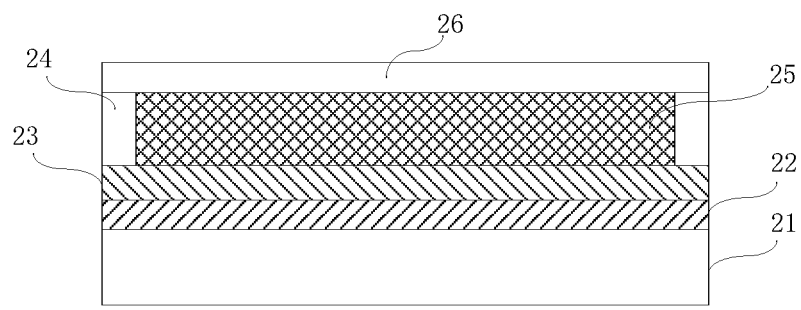

As shown in FIG. 2D, a capping layer 26 is formed on the support structure 24 and the sacrificial layer 25, and the bottom layer 22, the support structure 24 and the capping layer 26 together define a cavity.

Figure 2E:
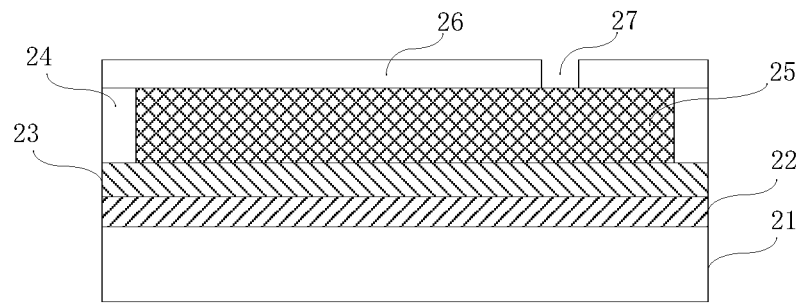

As shown in FIG. 2E, in this embodiment, the release hole 27 is formed for the MEMS release process. The release holes 27 penetrating through the capping layer 26 into the cavity are formed with photo pattern and etch processes.

Figure 2F:
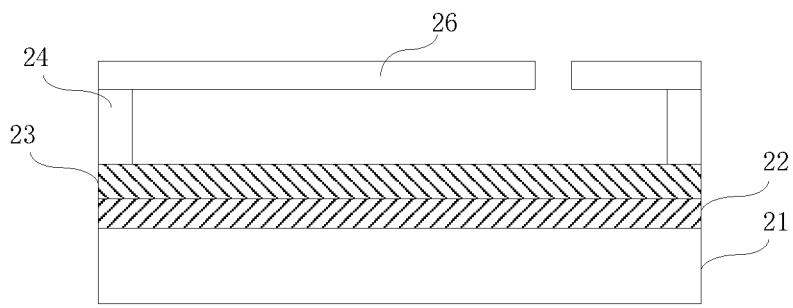
Figure 2G:
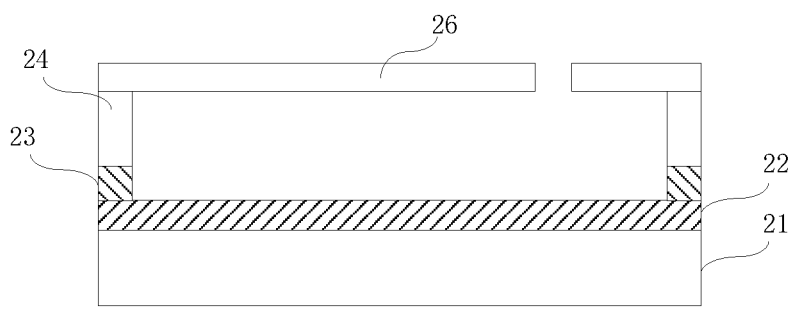

As shown in FIG. 2F, based on the designed etch time and etch rate, the amorphous sacrificial layer 25 is etched with $XeF_2$, and the ultra-thin oxide of the adhesion material layer 23 can protect the bottom layer 22 from $XeF_2$ within the designed etch time. As shown in FIG. 2G, after the amorphous sacrificial layer 25 etch completes, $XeF_2$ can further remove the ultra-thin oxide of the adhesion material layer 23 located below the sacrificial layer. In practical applications, some ultra-thin oxide residues may be left at corners of the cavity, however, this process method can finally minimize exposure of the dielectric, the metal thin film or the atomic layer of the bottom layer 22 to $XeF_2$. In this way, the surface of the bottom layer can be prevented from being changed into a hydrophilic surface to the maximum extent, thereby improving hydrophobicity of the contact surface in the cavity, and thus extending reliability and lifetime of the device.

Compared with the process method in the related art, in the method for forming the MEMS cavity structure provided by the embodiments of the present invention, the adhesion material layer is formed on the bottom layer, and then the sacrificial layer is formed on the adhesion material layer. A purpose of forming the adhesion material layer is to improve amorphous adhesion of the bottom layer of the cavity. After adhesion between the sacrificial layer and the underlying dielectric or metal layer is improved, integrity of the sacrificial layer in the subsequent process steps is enhanced, thereby resulting high production yields without amorphous layer delamination. Meanwhile, the adhesion material layer as an adhesion layer serves a role of isolation, and the sacrificial layer is isolated from the bottom layer by the adhesion material layer. In this case, when the sacrificial layer is released, the adhesion material layer can reduce $XeF_2$ exposure time of the bottom layer to an etchant gaseous/vapor chemistries, thereby preventing the surface of the bottom layer from being fluorinated and improving hydrophobicity of the contact surface in the cavity, and thus extending reliability and lifetime of the device.

The above description merely includes exemplary embodiments of the present invention, and is not intended to limit the scope of the present invention. Based on the specification and the drawings of the present invention, all equivalent structures or equivalent process transformations that may be directly or indirectly applied to other related technology fields are within the scope of the present invention.

Finally, it should be noted that, the above-described embodiments are merely for illustrating the present invention but not intended to provide any limitation. Although the present invention has been described in detail with reference to the above-described embodiments, it should be understood by those skilled in the art that, it is still possible to modify the technical solutions described in the above embodiments or to equivalently replace some or all of the technical features therein, but these modifications or replacements do not cause the essence of corresponding technical solutions to depart from the scope of the present invention.

What is claimed is:

1. A method for forming an MEMS cavity structure, comprising steps of:
    forming a bottom layer on a substrate;
    forming an adhesion material layer on the bottom layer;
    forming a support structure and a sacrificial layer that is filled in a space surrounded by the support structure, the support structure and the sacrificial layer are both on the adhesion material layer;
    forming a capping layer on the support structure and the sacrificial layer, and the bottom layer, the support structure and the capping layer together enclosing a cavity; and
    releasing the sacrificial layer on the adhesion material layer and then releasing the adhesion material layer to form the cavity structure.

2. The method for forming an MEMS cavity structure as described in claim 1, wherein prior to the step of forming an adhesion material layer on a bottom layer, the method further comprises a step of performing pretreatment on the bottom layer.

3. The method for forming an MEMS cavity structure as described in claim 1, wherein prior to the step of forming a support structure and a sacrificial layer on the adhesion material layer, the method further comprises a step of performing pretreatment on the adhesion material layer.

4. The method for forming an MEMS cavity structure as described in claim 1, wherein no pretreatment is performed on the bottom layer prior to the step of forming an adhesion material layer on a bottom layer, and no pretreatment is performed on the adhesion material layer prior to the step of forming a support structure and a sacrificial layer on the adhesion material layer.

5. The method for forming an MEMS cavity structure as described in claim 1, wherein said releasing the sacrificial layer and the adhesion material layer comprises:
    patterning the capping layer to form a release hole that penetrates through the capping layer into the cavity; and
    releasing the sacrificial layer and the adhesion material layer through the release hole.

6. The method for forming an MEMS cavity structure as described in claim 1, wherein said releasing the sacrificial layer and the adhesion material layer comprises: etching the sacrificial layer and the adhesion material layer with wet etchant, dry etchant, or vapor etchant.

7. The method for forming an MEMS cavity structure as described in claim 1, a material of the adhesion material layer is oxide, nitride, metal or sub-oxide.

8. The method for forming an MEMS cavity structure as described in claim 1, wherein the bottom layer is dielectric.

9. The method for forming an MEMS cavity structure as described in claim 1, wherein the bottom layer is a metal thin film, and a material of the metal thin film is aluminum, ruthenium, rhodium, tungsten or iridium.

10. The method for forming an MEMS cavity structure as described in claim 1, wherein the capping layer is MEMS structure or membrane.

11. The method for forming an MEMS cavity structure as described in claim 1, wherein a material of the sacrificial layer is amorphous silicon, amorphous germanium, or polymer.

12. The method for forming an MEMS cavity structure as described in claim 1, wherein said releasing the sacrificial layer and the adhesion material layer comprises: releasing the sacrificial layer and the adhesion material layer based on designed etching time and a designed etching rate, to further remove the adhesion material layer in the cavity after the sacrificial layer is removed.

13. The method for forming an MEMS cavity structure as described in claim 12, further comprising: determining the designed etching time and designed etching rate based on a material and a thickness of the adhesion material layer.

* * * * *